(12) United States Patent
Wu et al.

(10) Patent No.: US 10,729,026 B2
(45) Date of Patent: *Jul. 28, 2020

(54) CASING OF ELECTRONIC DEVICE

(71) Applicant: HTC Corporation, Taoyuan (TW)

(72) Inventors: Tim Chung-Ting Wu, Taoyuan County (TW); Cheng-Chieh Chuang, Taoyuan County (TW); Chi-Jen Lu, Taoyuan County (TW); Chun-Lung Chu, Taoyuan County (TW); Chien-Hung Lin, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/424,516

(22) Filed: May 29, 2019

(65) Prior Publication Data
US 2019/0281716 A1    Sep. 12, 2019

Related U.S. Application Data

(60) Continuation of application No. 14/990,800, filed on Jan. 8, 2016, which is a division of application No. 14/183,534, filed on Feb. 19, 2014, now Pat. No. 9,655,261.

(60) Provisional application No. 61/804,160, filed on Mar. 21, 2013.

(51) Int. Cl.
| | |
|---|---|
| *H05K 5/04* | (2006.01) |
| *G06F 1/16* | (2006.01) |
| *H05K 5/02* | (2006.01) |
| *H05K 5/00* | (2006.01) |
| *H05K 5/03* | (2006.01) |
| *H04M 1/02* | (2006.01) |

(52) U.S. Cl.
CPC .......... *H05K 5/0247* (2013.01); *G06F 1/1626* (2013.01); *G06F 1/1656* (2013.01); *H05K 5/0004* (2013.01); *H05K 5/0217* (2013.01); *H05K 5/03* (2013.01); *H05K 5/04* (2013.01); *H04M 1/0283* (2013.01); *Y10T 29/49* (2015.01)

(58) Field of Classification Search
CPC ........... H05K 5/03; H05K 5/04; G01F 1/1626
See application file for complete search history.

(56) References Cited

U.S. PATENT DOCUMENTS

| | | | | |
|---|---|---|---|---|
| 8,947,303 | B2* | 2/2015 | Golko | G06F 1/1698 343/702 |
| 9,287,627 | B2* | 3/2016 | Jarvis | H01Q 1/243 |
| 9,893,755 | B2* | 2/2018 | Mow | H01Q 9/0442 |
| 10,234,906 | B2* | 3/2019 | Myers | H01Q 1/2258 |

(Continued)

*Primary Examiner* — Hung V Ngo
(74) *Attorney, Agent, or Firm* — JCIPRNET

(57) ABSTRACT

A casing of an electronic device including a metallic housing and a first non-conductive spacer is provided. The metallic housing has an inner surface and an outer surface opposite to the inner surface, and the outer surface has a back side and lateral sides connecting with the back side. The inner surface is substantially a recessed structure. The metallic housing has a first gap communicating the inner surface and the outer surface, and the metallic housing further includes a second gap and at least one connecting terminal. The first non-conductive spacer is selectively disposed in the first gap of the metallic housing, and extends from a first side of the lateral sides of the metallic housing to the back side of the metallic housing.

10 Claims, 7 Drawing Sheets

(56) References Cited

U.S. PATENT DOCUMENTS

| | | | | |
|---|---|---|---|---|
| 2013/0257659 A1* | 10/2013 | Darnell | ................ | H01Q 1/243 |
| | | | | 343/702 |
| 2016/0116948 A1* | 4/2016 | Ou | ...................... | G06F 1/1698 |
| | | | | 361/679.56 |
| 2017/0347470 A1* | 11/2017 | Seo | .................... | H05K 5/0004 |
| 2019/0393588 A1* | 12/2019 | Jarvis | .................. | G06F 1/1626 |

* cited by examiner

CASING OF ELECTRONIC DEVICE

CROSS-REFERENCE TO RELATED APPLICATION

This application is a continuation application of and claims the priority benefit of U.S. application Ser. No. 14/990,800, filed on Jan. 8, 2016, now allowed. The prior U.S. application Ser. No. 14/990,800 is a divisional application of and claims the priority benefit of U.S. application Ser. No. 14/183,534, filed on Feb. 19, 2014, now patented, which claims the priority benefits of U.S. provisional application Ser. No. 61/804,160, filed on Mar. 21, 2013. The entirety of each of the above-mentioned patent applications is hereby incorporated by reference herein and made a part of this specification.

TECHNICAL FIELD

The invention relates to a casing, and particularly to a casing of an electronic device.

RELATED ART

In recent years, electronic devices, such as notebooks (NB), tablet computers, and smart phones, have been widely used in daily life along with the development of technologies. Types and functions of the electronic devices are increasingly diversified, and the electronic devices are more popular due to convenience and practicality thereof and can be used for different purposes.

In order to maintain a mechanical strength of a casing of an electronic device while pursuing for slim design, a conventional method is to manufacture the casing of the electronic device with different materials by bonding metal parts and plastic parts. The metal parts and the plastic parts may be bonded by adhesives, but such method may lead to steps or gaps generated by differences in element sizes or assembly tolerances between the metal parts and the plastic parts, which affects quality of the casing of the electronic device in terms of exterior. Accordingly, in order to provide the casing of the electronic device with a seamless exterior, it is changed nowadays to bond the metal parts and the plastic part by using an insert molding technique or an in-mold technique. However, an anodizing process may also be adopted as in the conventional art for dyeing the outer surface of the metal parts in current technology, so that the casing of the electronic device may provide a color exterior. During manufacturing processes, if the metal parts of the casing of the electronic device are dyed before bonding the metal parts and the plastic parts, the metal parts are prone to damages from molds in the insert molding process or the in-mold process, which affects the color exterior. If the metal parts and the plastic parts are bonded before dyeing the casing of the electronic device by the anodizing process, an airtight ability between the metal parts and the plastic parts may be insufficient, such that a process solvent used in the anodizing process may easily be remained in between the two, resulting a problem of uneven dyeing in the subsequent dyeing process.

SUMMARY OF THE INVENTION

The invention is directed to a casing of an electronic device that is capable of providing favorable mechanical strength and seamless appearance.

The casing of the electronic device of the invention includes a metallic housing and a first non-conductive spacer. The metallic housing has an inner surface and an outer surface opposite to the inner surface. The outer surface has a back side and lateral sides connecting with the back side. The inner surface is substantially a recessed structure, and the metallic housing has a first gap connecting through the inner surface and the outer surface, wherein the metallic housing further includes a second gap and at least one connecting terminal. The first non-conductive spacer is selectively disposed in the first gap of the metallic housing, wherein the first non-conductive spacer extends from a first side of the lateral sides of the metallic housing to the back side of the metallic housing.

Based on above, in the casing of the electronic device of the invention, the inner surface is substantially a recessed structure, wherein the metallic housing has a first gap connecting through the inner surface and the outer surface, and the first non-conductive spacer is selectively disposed in the first gap of the metallic housing and extends from the first side of the lateral sides of the metallic housing to the back side of the metallic housing. Accordingly, the casing of the electronic device may be provided with a seamless appearance along with favorable mechanical strength for supporting the electronic device.

To make the above features and advantages of the invention more comprehensible, several embodiments accompanied with drawings are described in detail as follows.

DESCRIPTION OF THE EMBODIMENTS

Figure 1A:
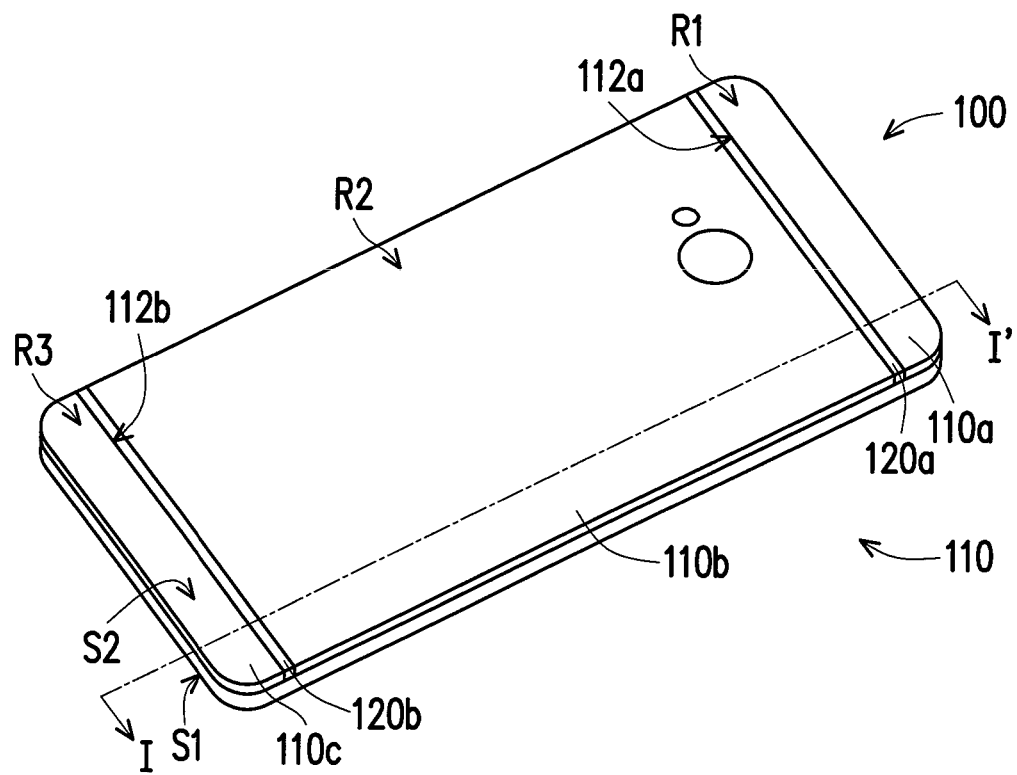
FIG. 1A is a schematic diagram of a casing of an electronic device according to an embodiment of the invention.
Figure 1B:
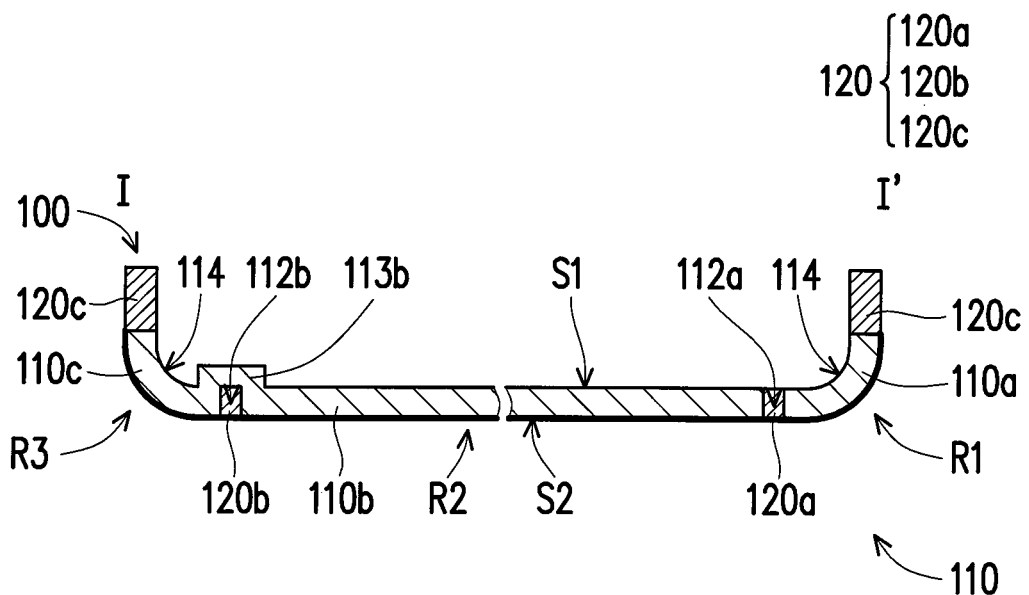
FIG. 1B is a cross-sectional diagram of the electronic device of FIG. 1A taken along line I-I'.

FIG. 1A is a schematic diagram of a casing of an electronic device according to an embodiment of the invention. FIG. 1B is a cross-sectional diagram of the electronic device of FIG. 1A taken along line I-I'. Referring to FIG. 1A and FIG. 1B, in the present embodiment, a casing 100 of an electronic device includes a metallic housing 110, a first non-conductive spacer 120a and a second non-conductive spacer 120b, wherein the metallic housing 110 includes an inner surface S1 and an outer surface S2 opposite to the inner surface S1. The inner surface S1 is recessed inwardly to substantially form a recessed structure, so that the rest of components (e.g., a battery, a circuit board or an audio device) of an electronic device (not illustrated) may be disposed in the casing 100 of the electronic device. The casing 100 of the electronic device may be used to cover the rest of components suitable for the electronic device, so as to form the electronic device. The electronic device is, for example, a smart phone, and the casing 100 of the electronic device is, for example, a casing of the smart phone. Nonetheless, the types of the electronic device and the casing 100 of the electronic device are not particularly limited in the invention.

Figure 4:
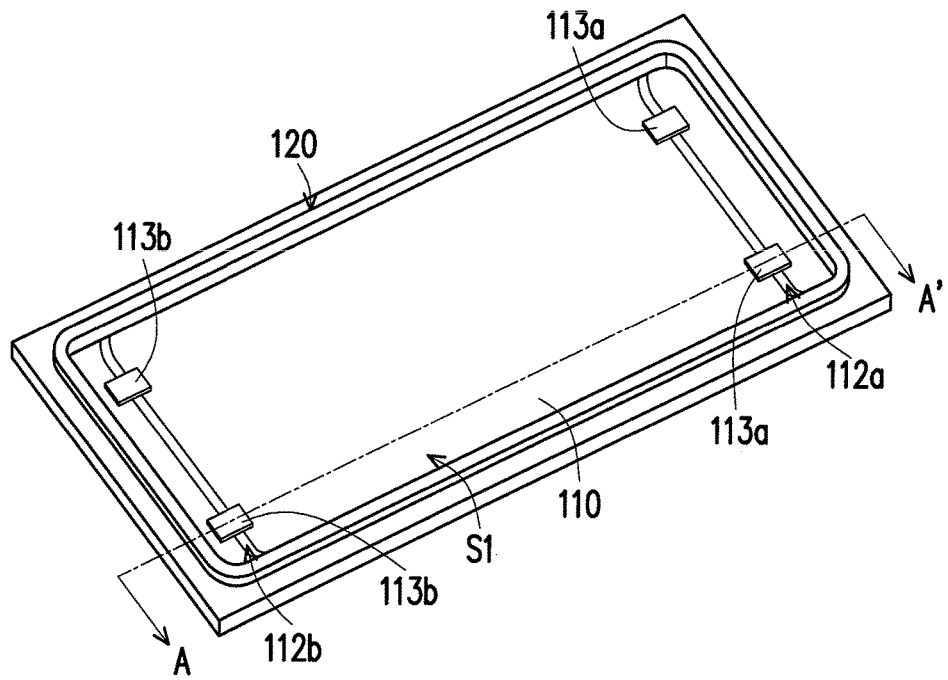
FIG. 4 is a schematic diagram of the casing of the electronic device of FIG. 3D.
Figure 5:
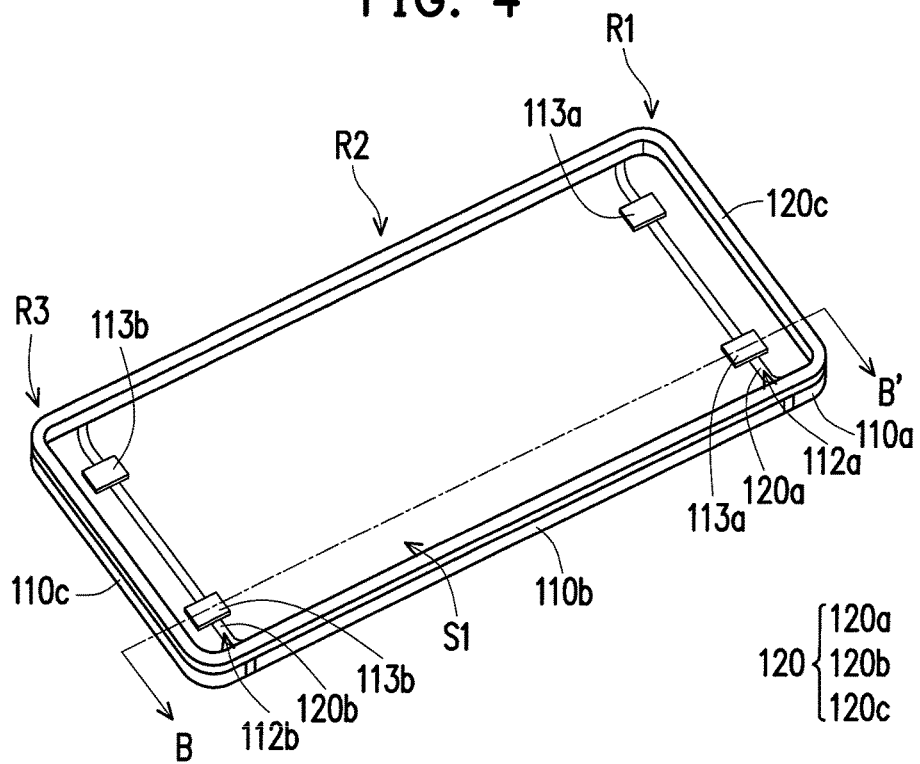
FIG. 5 is a schematic diagram of the casing of the electronic device of FIG. 3E.

More specifically, in the present embodiment, the metallic housing 110 includes a first gap 112a and a second gap 112b connecting through the inner surface S1 and the outer surface S2. The first gap 112a and the second gap 112b are respectively located at two opposite sides of the metallic housing 110 and substantially in parallel, but a relative position of the first gap 112a and the second gap 112b is not particularly limited in the invention. In advance, in the present embodiment, the metallic housing 110 includes an upper cover 110a, a middle cover 110b and a lower cover 110c, in which the middle cover 110b is located between the upper cover 110a and the lower cover 110c. The first gap 112a is located between the upper cover 110a and the middle cover 110b, and the second gap 112b is located between the middle cover 110b and the lower cover 110c. In addition, the casing 100 of the electronic device of the present embodiment includes a non-conductive layer 120 disposed on the inner surface S1 of the metallic housing 110, wherein part of the non-conductive layer 120 is exposed to the outer surface S2 of the metallic housing 110. More specifically, part of the non-conductive layer 120 of the present embodiment includes a first non-conductive spacer 120a and a second non-conductive spacer 120b which are extended from the inner surface S1 to the outer surface S2. The first non-conductive spacer 120a and the second non-conductive spacer 120b are disposed in the first gap 112a and the second gap 112b of the metallic housing 110, respectively. Furthermore, the non-conductive layer 120 also includes a non-conductive frame 120c disposed on the inner surface S1 of the metallic housing 110 and surrounding periphery of the metallic housing 110 (as illustrated in FIG. 4 and FIG. 5).

In the present embodiment, the first non-conductive spacer 120a and the second non-conductive spacer 120b are substantially strip structure and embedded in the first gap 112a and the second gap 112b. Nevertheless, the shapes of the first non-conductive spacer 120a and the second non-conductive spacer 120b are not particularly limited in the invention. The first gap 112a and the second gap 112b substantially separate the upper cover 110a, the middle cover 110b, and the lower cover 110c from each other. More specifically, in the present embodiment, the first gap 112a and the second gap 112b completely separate the upper cover 110a, the middle cover 110b and the lower cover 110c from each other (as shown in FIG. 1B), so that the upper cover 110a, the middle cover 110b and the lower cover 110c (which are all conductive) are separated from each other. And, because the first non-conductive spacer 120a and the second non-conductive spacer 120b are non-conductive, the upper cover 110a, the middle cover 110b and the lower cover 110c may be electrically insulated from each other by disposing the first non-conductive spacer 120a and the second conductive spacer 120b in the first gap 112a and the second gap 112b. Accordingly, the metallic housing 110 may be divided into a plurality of regions adjacent to but not contacting each other, such as three regions R1, R2 and R3 depicted in FIG. 1A and FIG. 1B. However, in other embodiments, the gaps may be selectively disposed at lateral sides of the metallic housing 110 based on requirements, and extended only to the middle of the metallic housing 110. In this case, the upper cover 110a, the middle cover 110b and the lower cover 110c may be separated by the gaps, but the upper cover 110a, the middle cover 110b and the lower cover 110c are still contacting each other. In other words, in case the upper cover 110a, the middle cover 110b and the lower cover 110c are not required to be electrically insulated from each other (e.g., in case the upper cover 110a, the middle cover 110b and the lower cover 110c are not used as antenna regions, or different design for the antenna regions are adopted in the subsequent process), the gaps do not need to completely separate the upper cover 110a, the middle cover 110b and the lower cover 110c from each other, thus the invention is not limited to aforesaid embodiment. Although the casing 100 of the electronic device of the present embodiment includes the first non-conductive spacer 120a and the second non-conductive spacer 120b and the metallic housing 110 includes the first gap 112a and the second gap 112b, the casing 100 of the electronic device may still adjust quantity and position of the gaps and non-conductive spacers based on requirement as in other embodiments.

Furthermore, in the present embodiment, the metallic housing 110 further includes two connecting terminals 114 corresponding to the upper cover 110a and the lower cover 110c of the metallic housing 110, respectively. More specifically, the connecting terminals 114 are formed by the inner surface S1 of the metallic housing 110. While disposing the rest of the components of the electronic device in the casing 100 of the electronic device, the rest of the components of the electronic device may be electrically connected to the metallic housing 110 by the connecting terminals 114. Although the connecting terminals 114 of the present embodiment are illustrated as two for example, and the two connecting terminals 114 are corresponding to the upper cover 110a and the lower cover 110c, respectively, the casing 100 of the electronic device may still adjust quantity and position of the connecting terminals 114 of the casing 100 of the electronic device based on requirements as in other embodiments.

Since part of the non-conductive layer 120 formed in the first gap 112a and the second gap 112b and exposed to the outer surface S2 of the metallic housing 110 divides the metallic housing 110 into the regions R1, R2 and R3 adjacent to but not contacting each other, wherein the regions R1 and R3 may serve as the antenna region, such that the electronic device may be provided with functions of an antenna. For instance, the antenna region formed by the region R1 may be applied in technologies such as Bluetooth (BT) transmission, Wireless Fidelity (WiFi), Globe Positioning System (GPS) or Diversity antenna; whereas the antenna region formed by the region R3 may be applied in technologies such as global system for mobile communications (GSM), Long Term Evolution (LTE) network and Wide-band Code Division Multiple Access (WCDMA). Therefore, the casing 100 of the electronic device allows the electronic device to combine with a plurality of wireless transmission device for expanding functionality of the electronic device.

On the other hand, in the present embodiment, the casing 100 of the electronic device has a color appearance which is presented by the outer surface S2 of the metallic housing 110 dyed by a process solvent with colors. Therefore, in addition to steps of forming the first gap 112a and the second gap 112b on the metallic housing 110, forming the first non-conductive spacer 120a and the second non-conductive spacer 120b disposed in the first gap 112a and the second gap 112b, and forming the non-conductive frame 120c on the metallic housing 110, process of manufacturing the casing 100 of the electronic device according to the embodiments of the invention also requires to dye the metallic housing 110. Accordingly, an order of aforesaid steps may affect a yield rate of the process. For instance, if the metallic housing 110 is dyed before bonding the dyed metallic housing 110 with the non-conductive layer 120, the metallic housing 110 is prone to be damaged from molds during the bonding process to affect the color appearance thereof. If the metallic housing 110 is bonded with the non-conductive layer 120 before dyeing the metallic housing 110, the process solvent may be easily remained between the metallic housing 110 and the non-conductive layer 120, resulting a problem of uneven dyeing in the subsequent dyeing process. Accordingly, the casing 100 of the electronic device is manufactured by using the following method, which is capable of reducing incidence of said problem to decrease a possibility of the uneven dyeing of the casing of the electronic device.

Figure 2:
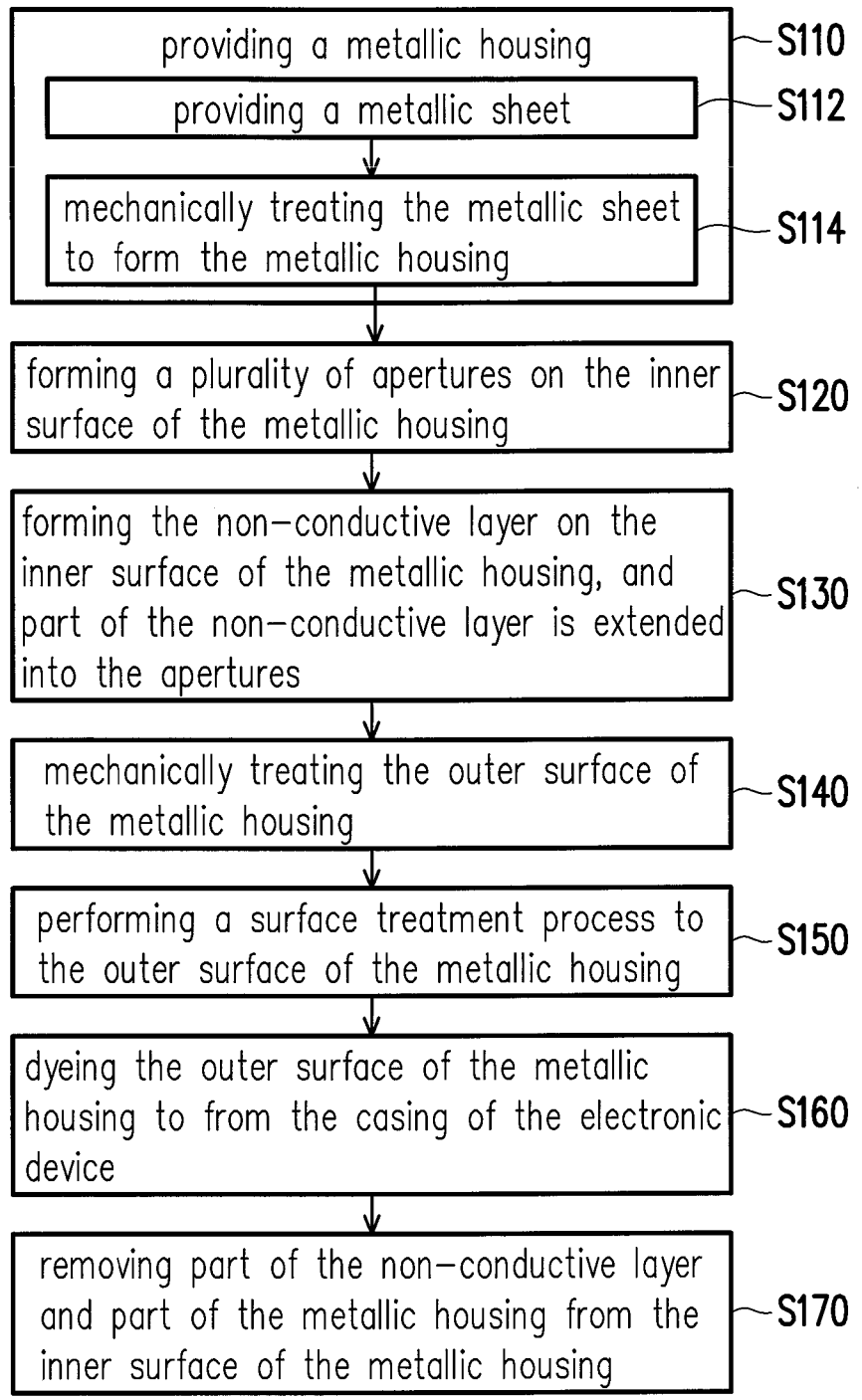
FIG. 2 is a flowchart of a method of manufacturing the casing of the electronic device of FIG. 1A.

FIG. 2 is a flowchart of a method of manufacturing the casing of the electronic device of FIG. 1A. FIG. 3A to FIG. 3G are schematic diagrams illustrating flows for the method of manufacturing the casing of the electronic device of FIG. 1A. FIG. 3A to FIG. 3G illustrate each step in the method of manufacturing the casing 100 of the electronic device according to the embodiments of the invention in sequence. The method of manufacturing the casing 100 of the electronic device according to the embodiments of the invention are described sequentially in text below by reference with FIG. 2 and FIG. 3A to FIG. 3G.

Figure 3A:
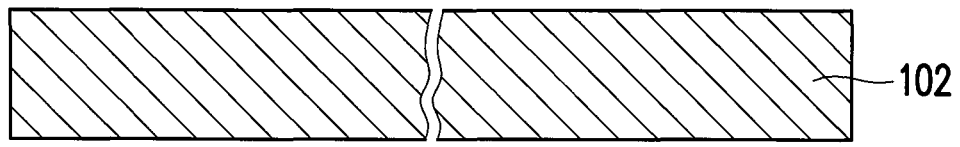
FIG. 3A to FIG. 3G are schematic diagrams illustrating flows for the method of manufacturing the casing of the electronic device of FIG. 1A.
Figure 3B:
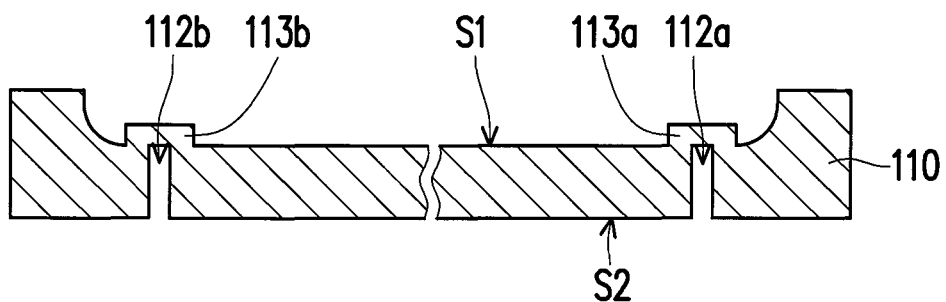

First, referring to FIG. 2, FIG. 3A and FIG. 3B, the metallic housing 110 is provided in step S110. In the present embodiment, the step of providing the metallic housing 110 includes the following steps. In step S112, a metallic sheet 102 is provided, as shown in FIG. 3A. A material of the metallic sheet 102 is aluminum for example, but the material of the metallic sheet 102 is not particularly limited in the invention. Next, in step S114, the metallic sheet 102 is mechanically treated to form the metallic housing 110 in which the metallic housing 110 includes the inner surface S1 and the outer surface S2 opposite to the inner surface S1. The step of machining the metallic sheet 102 includes, for example, a computer numerical control (CNC) treatment, but the method of machining the metallic sheet 102 is not particularly limited in the invention. The inner surface S1 recessed inwardly is formed after machining the metallic sheet 102 while the outer surface S2 may maintain a status of not being treated, as shown in FIG. 3B. In addition, in the present embodiment, the step of machining the metallic sheet 102 in step S104 includes forming two gaps (the first gap 112a and the second gap 112b) on the inner surface S1 of the metallic housing 110, and the first gap 112a and the second gap 112b are extended to the outer surface S2. In the present embodiment, the step of forming the two gaps includes machining one surface of the metallic sheet 102 (e.g., an upper surface of the metallic sheet 102 as shown in FIG. 3B) to form the inner surface S1 recessed inwardly, and then machining another surface of the metallic sheet 102 (e.g., a lower surface of the metallic sheet 102 as shown in FIG. 3B), so as to form the first gap 112a and the second gap 112b connecting through the inner surface S1 inwardly from the outer surface S2 of the metallic sheet 102. The first gap 112a and the second gap 112b are respectively located on two ends (a front end and a back end) of the metallic housing 110 to substantially divide the metallic housing 110 into three regions. In addition, in the step of machining the metallic sheet 102 further includes forming a plurality of supporting structures 113a and 113b on the inner surface S1 of the metallic housing 110. The supporting structures 113a and 113b are, for example, connecting bridges, wherein the supporting structures 113a are disposed on the first gap 112a, and the supporting structures 113b are disposed on the second gap 112b. Although only one of the supporting structures 113a and only one of the supporting structures 113b are illustrated in the cross-sectional diagram of FIG. 3B, practically, two supporting structures 113a and two supporting structures 113b may be disposed on the inner surface S1 of the metallic housing 110 (as illustrated in FIG. 4). That is, each of the gaps is correspondingly disposed with two supporting structures. Because the first gap 112a and the second gap 112b of the present embodiment substantially penetrate through the metallic housing 110 to divide the metallic housing 110 into the three regions not contacting each other, a relative position between the three regions of the metallic housing 110 and mechanical strengths thereof may be maintained by disposing the supporting structures 113a and 113b. Despite the present embodiment disposing the two supporting structures between each of the gaps, in other embodiments, each of the gaps may also be disposed with only one or even more of the supporting structures, and the invention is not limited thereto. Further, in an embodiment with the metallic housing 110 not completely separated by the gaps, said supporting structures may be omitted, and whether to dispose the supporting structures or not is not particularly limited in the invention. Forming the gaps on the inner surface S1 of the metallic housing allows the non-conductive layer 120 formed in the subsequent steps to also extend into the gaps, thus quantity, position and whether to dispose them or not are not limited in the invention, which may be adjusted based on requirements.

Figure 3C:
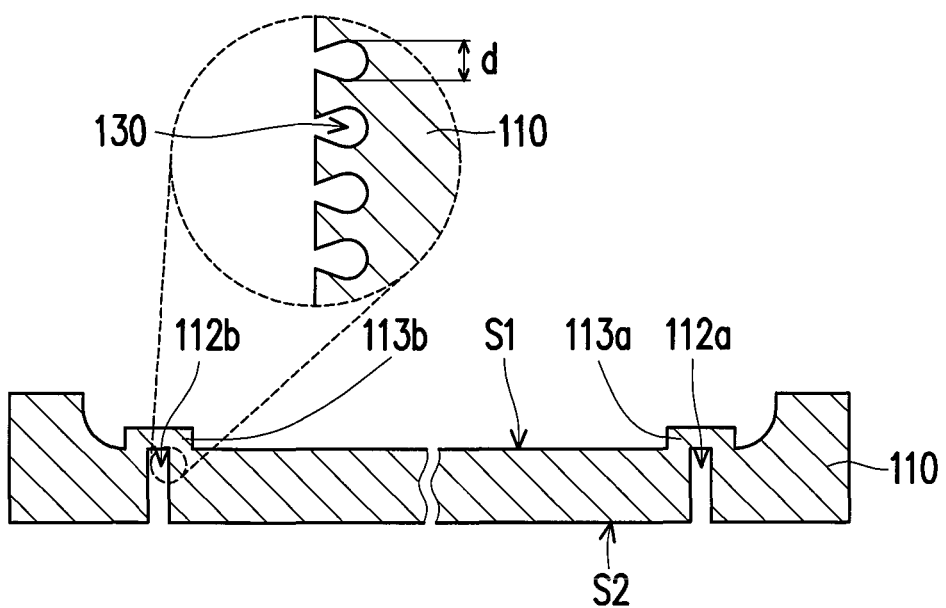
Figure 3D:
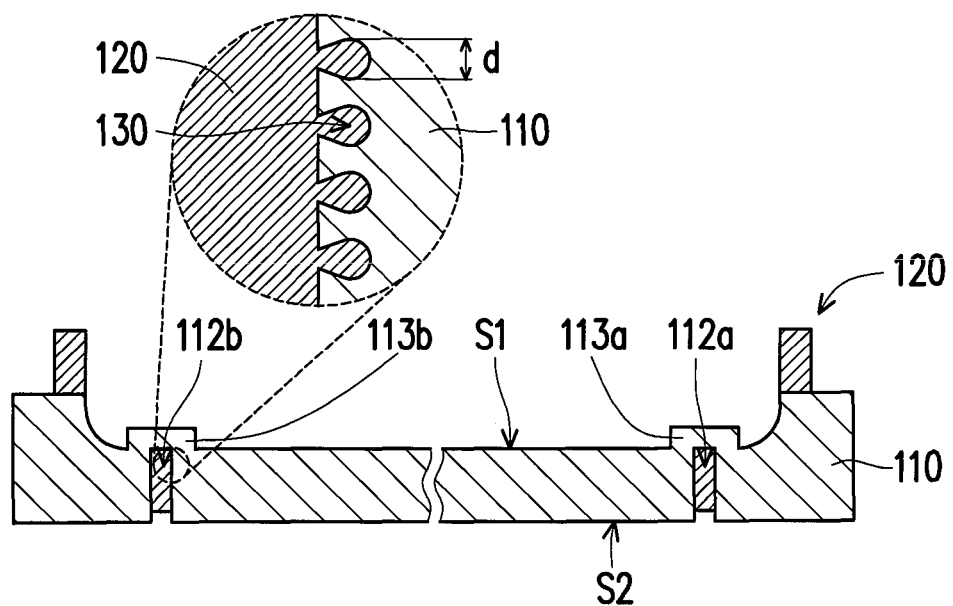

Next, referring to FIG. 2, FIG. 3C and FIG. 3D, a plurality of apertures 130 are formed on the inner surface S1 of the metallic housing 110 in step S120, and the non-conductive layer 120 is formed on the inner surface S1 of the metallic housing 110 and part of the non-conductive layer 120 is extended into the apertures 130 in step S130. In the present embodiment, the step of forming the apertures 130 on the inner surface S1 of the metallic housing 110 includes a nano molding technology (NMT), but the invention is not limited thereto.

In FIG. 3C, the step of forming the apertures 130 on the inner surface S1 of the metallic housing 110 (step S120) includes flushing the inner surface S1 of the metallic housing 110 by an acidic solvent, and forming the apertures 130 on the inner surface S1 of the metallic housing 110. An inner diameter d of the apertures 130 is between 20 nm to 100 nm. In other words, a size of the apertures 130 formed on the inner surface S1 of the metallic housing 110 is in nanoscale. In addition, because the inner surface S1 of the metallic housing 110 of the present embodiment includes the first gap 112a and the second gap 112b, the step of forming the apertures 130 on the inner surface S1 of the metallic housing 110 (step S120) further includes forming the apertures 130 on surfaces of the gaps (the first gap 112a and the second gap 112b) of the metallic housing 110. In other words, the inner surface S1 of the metallic housing 110 and the surfaces of the first gap 112a and the second gap 112b may all have the apertures 130 formed thereon by the acidic solvent at the same time. For the convenience of the process, the step of flushing the inner surface S1 of the metallic housing 110 (step S120) may include flushing the entire metallic housing 110 by the acidic solvent (e.g., dipping the entire metallic housing 110 into the acidic solvent), or flushing the metallic housing 110 comprehensively by the acidic solvent, so as to form the apertures 130 on surfaces (including the inner surface S1, the outer surface S2, and the surfaces of the first gap 112a and the second gap 112b) of the entire metallic housing 110. In other words, whether the outer surface S2 of the metallic housing 110 includes the apertures 130 is not particularly limited in the invention.

In the present embodiment, the method of manufacturing the casing 100 of the electronic device further includes the following steps. The metallic housing 110 is washed before the step of flushing the entire metallic housing 110 by the acidic solvent, and after the step of flushing the entire metallic housing 110 by the acidic solvent. More specifically, after the step of providing the metallic housing 110 (step S110), and before the step of flushing the entire metallic housing 110 by the acidic solvent, the metallic housing 110 may be washed to prevent dust or oil remained during the process of machining from affecting the surfaces of the metallic housing 110 and reacting with the acidic solvent thereby influencing the formation of the apertures 130. Similarly, after the step of flushing the entire metallic housing 110 by the acidic solvent, the metallic housing 110 may be washed to prevent the acidic solvent from remaining to affect the subsequent process of dyeing the metallic housing 110.

FIG. 4 is a schematic diagram of the casing of the electronic device of FIG. 3D, and FIG. 3D may be considered as a cross-sectional diagram of the casing of the electronic device of FIG. 4 taken along line A-A'. Referring to FIG. 3D and FIG. 4, in the present embodiment, the step of forming the non-conductive layer 120 on the inner surface S1 of the metallic housing 110 (step S130) includes an in-mold process, wherein a material of the non-conductive layer 120 may be a plastic, but material and forming method of the non-conductive layer 120 are not particularly limited in the invention. The step of forming the on-conductive layer 120 on the inner surface S1 of the metallic housing 110 (step S130) includes, for example, placing the metallic housing 110 into a mold (not illustrated), and injecting a flowing plastic into the mold, wherein part of the flowing plastic is filled into the apertures 130, so that part of the non-conductive layer 120 after molding may be extended into the apertures 130, as shown in FIG. 3D. The non-conductive layer 120 of the present embodiment is formed periphery on the inner surface S1 of the metallic housing 110. The non-conductive layer 120 surrounds periphery of the inner surface S1 in circle, and constitutes a local side of the casing 100 of the electronic device after the following-up processes. In addition, because the metallic housing 110 of the present embodiment includes the first gap 112a and the second gap 112b, and the apertures 130 are provided on the surfaces of the first gap 112a and the second gap 112b, in the step of forming the non-conductive layer 120 on the inner surface S1 of the metallic housing 110 (step S130), part of the non-conductive layer 120 is formed within the gaps (the first gap 112a and the second gap 112b) and extended into the apertures 130 formed on the surfaces of the gaps (the first gap 112a and the second gap 112b). In other words, during the in-mold process, part of the flowing plastic may also flow into the first gap 112a and the second gap 112b as well as the apertures 130 located on the surfaces of the first gap 112a and the second gap 112b, so that part of the non-conductive layer 120 after molding may be extended into the first gap 112a and the second gap 112b as well as the apertures 130 located on the surfaces of the first gap 112a and the second gap 112b.

In the method of manufacturing the casing 100 of the electronic device, the apertures 130 are formed on the inner surface S1 of the metallic housing 110 and the surfaces of the first gap 112a and the second gap 112b before the step of forming the non-conductive layer 120 on the inner surface S1 of the metallic housing 110 and the first gap 112a and the second gap 112b, thus the non-conductive layer 120 may be extended into the apertures 130. In the present embodiment, the metallic housing 110 and the non-conductive layer 120 are bonded by the in-mold process, and part of the non-conductive layer 120 is extended into the apertures 130, such that a favorable bonding force may be provided between the metallic housing 110 and the non-conductive layer 120 for enhancing the mechanical strength of the casing 100 of the electronic device formed in the subsequent process. In addition, because the size of the apertures 130 of the present embodiment is in nanoscale, the flowing plastic may be completely infiltrated into the apertures 130. Accordingly, a favorable airtight ability may be provided between the metallic housing 110 and the non-conductive layer 120 to stop liquid or gas from passing through, so as to achieve a zero-gap design.

Figure 3E:
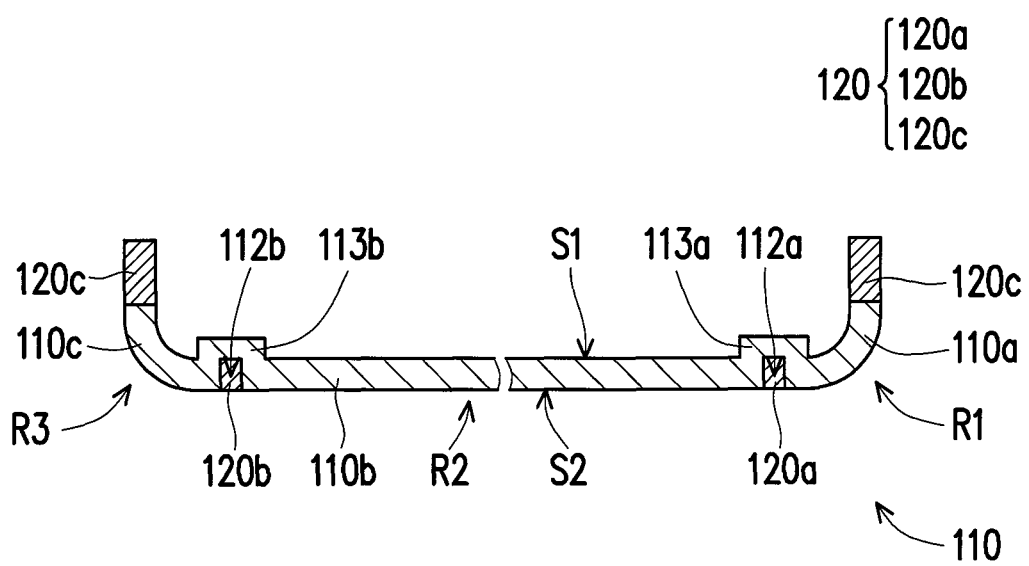

Next, referring to FIG. 2, FIG. 3E and FIG. 5. Therein, FIG. 5 is a schematic diagram of the casing of the electronic device of FIG. 3E, and FIG. 3E may be considered as a cross-sectional diagram of the casing of the electronic device of FIG. 5 taken along line B-B'. In step S140, the outer surface S2 of the metallic housing 110 is mechanically treated. In the present embodiment, after the step of forming the non-conductive layer 120 on the inner surface S1 of the metallic housing 110 (step S130), the outer surface S2 of the metallic housing 110 is mechanically treated to remove part of the metallic housing 110 to expose part of the non-conductive layer 120 formed in the first gap 112a and the second gap 112b to the outer surface S2 of the metallic housing 110, so as to form a plurality of non-conductive spacers (the first non-conductive spacer 120a and the second non-conductive spacer 120b) located in the first gap 112a and the second gap 112b. In addition, lateral sides of the outer surface S2 of the metallic housing 110 are also removed, wherein part of the non-conductive layer 120 surrounding periphery of the inner surface S1 forms the non-conductive frame 120c, and constitutes sidewalls of the casing 100 of the electronic device together with the rest of the lateral sides of the metallic housing 110, as shown in FIG. 5. The step of machining the outer surface S2 of the metallic housing 110 includes, for example, a computer numerical control (CNC) treatment, but the method of machining the outer surface S2 of the metallic housing 110 is not particularly limited in the invention. By machining the outer surface S2 of the metallic housing 110, a shape of the appearance of the casing 100 of the electronic device may be adjusted accordingly. For instance, the lateral sides of the metallic housing 110 of the present embodiment are substantially aligned with the non-conductive frame 120c, so that the sidewalls of the casing 100 of the electronic device may be flat. In addition, by machining the outer surface S2 of the metallic housing 110, the first non-conductive spacer 120a and the second non-conductive spacer 120b may be exposed to the lateral sides of the metallic housing and substantially aligned with the lateral sides of the metallic housing 110. Accordingly, the outer surface S2 of the metallic housing 110 and the first non-conductive spacer 120a, the second non-conductive spacer 120b and the non-conductive frame 120c exposed to the outer surface S2 of the metallic housing 110 may provide a seamless appearance, but the invention is not limited thereto, they may be adjusted based on requirements in the shape of the casing 100 of the electronic device.

Furthermore, in the present embodiment, the first non-conductive spacer 120a and the second non-conducive spacer 120b formed in the first gap 112a and the second gap 112*b* and exposed to the outer surface S2 of the metallic housing 110 may divide the metallic housing 110 into the upper cover 110*a*, the middle cover 110*b*, and the lower cover 110*c* which are separated and electrically insulted from each other, and the upper cover 110*a*, the middle cover 110*b*, and the lower cover 110*c* may correspondingly from the three regions which are adjacent to but not contacting each other, such as the regions R1, R2, and R3. The upper cover 110*a*, the middle cover 110*b*, and the lower cover 110*c* which are separated from each other may be connected by the supporting structures 113*a* and 113*b*, so as maintain the relative position thereof during the process of manufacturing the casing 100 of the electronic device. However, in other embodiments, although the gaps and the non-conductive spacers formed in the gaps and exposed to the outer surface S2 of the metallic housing 110 may divide the metallic housing 110 into the regions which are adjacent to but not contacting each other, quantity and range of the regions may by adjusted according to quantity and position of the gaps and the non-conductive spacers and whether to dispose them, and the invention is not limited thereto.

Next, referring to FIG. 2, in step S150, a surface treatment process is performed to the outer surface S2 of the metallic housing 110. In the present embodiment, after the step of machining the outer surface S2 of the metallic housing 110 (step S140), the surface treatment process is performed to the outer surface S2 of the metallic housing 110. The surface treatment process may include cleaning the outer surface S2 of the metallic housing 110, and may also be decorating the outer surface S2 of the metallic housing 110. A method of decorating the outer surface S2 of the metallic housing 110 may be, for example, forming a rough surface on the outer surface by a sandblasting process, or making the outer surface S2 a glossy surface by a polishing process, or may also be forming hairlines on the outer surface S2 by a grinding process, so that the outer surface S2 of the metallic housing 110 may provide a special tactile effect or a special visual effect. In other embodiments, the type of the surface treatment process may be selected based on actual requirements, and the surface treatment process to the outer surface S2 the metallic housing 110 may also be omitted.

Figure 3F:
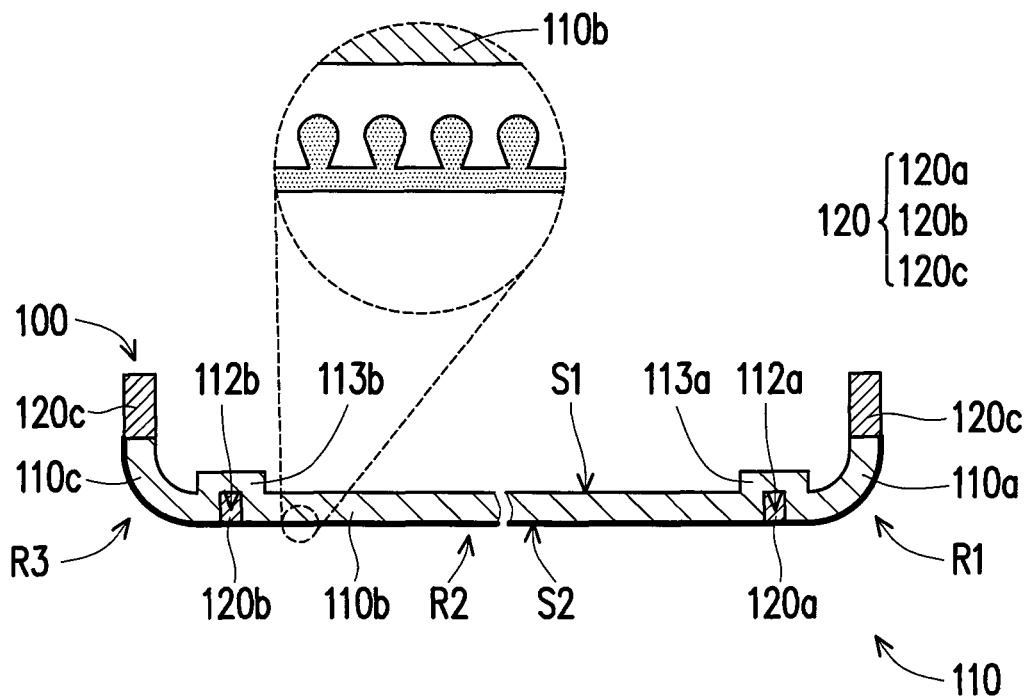

Next, referring to FIG. 2 and FIG. 3F, in step S160, the outer surface S2 of the metallic housing 110 is dyed to from the casing 100 of the electronic device. In the present embodiment, the step of dyeing the outer surface S2 of the metallic housing 110 includes an anodizing process. The anodizing process is a surface treatment technology with a main purpose to extend lifetime of a metal object or improve an aesthetics of the metal object by changing physical, mechanical, and chemical properties of a surface of the metal object for improving a surface characteristic thereof (e.g., improving capabilities like etch-proof, heat-proof, or improving conductivity for the metal object). In the anodizing process, the metal object (e.g., metallic housing 110 of the present embodiment) is placed at a anode in an electrolysis tank, and a determined voltage and current is applied to facilitate the surface of the metal object in forming a favorable metal oxide layer, and the metallic housing 110 may provide the same voltage to the upper cover 110*a*, the middle cover 110*b* and the lower cover 110*c* through conduction of the supporting structures 113*a* and 113*b* (as shown in an enlarged diagram of FIG. 3F). Because the material of metallic housing 110 in the present embodiment is aluminum, a material of the metal oxide layer formed on the outer surface S2 of the metallic housing 110 by the anodizing process is aluminum oxide. Accordingly, the anodizing process is capable forming the metal oxide layer (which is dense and with protectiveness) based on a base metal on the surface of the metallic housing 110, so as to enhance the mechanical strength of the metallic housing 110. And, said metal oxide layer may include apertures, such that the colors in the subsequent dyeing step may be infiltrated into inner layers of the metallic housing 110. After forming the metal oxide layer on the outer surface S2 of the metallic housing 110, the metallic housing 110 having the metal oxide layer may be dyed by the process solvent with colors. Dyes in the process solvent may be filled into the apertures of the metal oxide layer to dye the metal oxide layer, so that the casing 100 of the electronic device may provide the color appearance. After dyeing by the process solvent with colors, a washing process may be performed to the casing 100 of the electronic device having the color appearance, so as to decrease the possibility of the uneven dyeing caused by the remained process solvent.

Figure 3G:
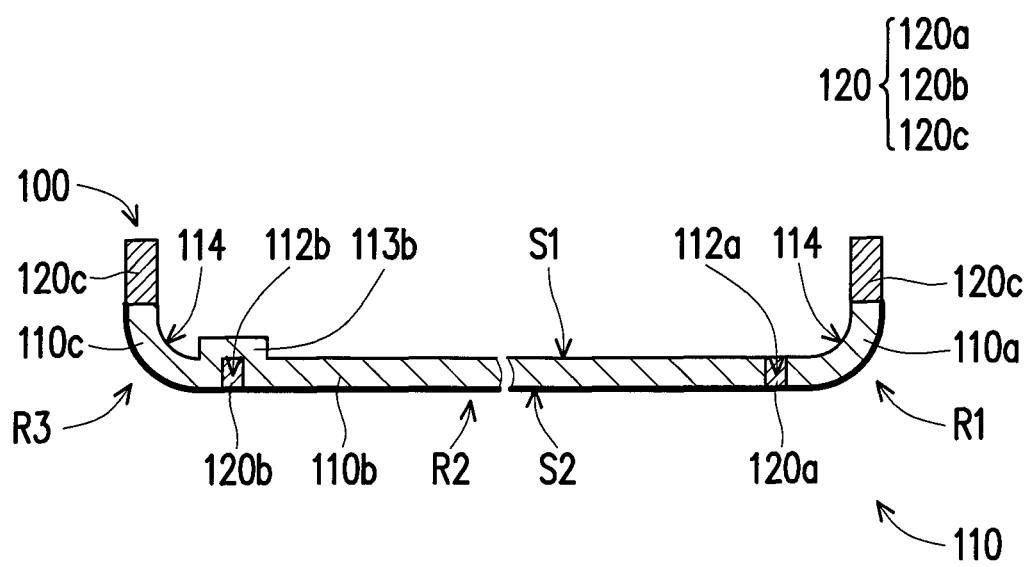

Lastly, referring to FIG. 2 and FIG. 3G, in step S170, part of the non-conductive layer 120 and part of the metallic housing 110 are removed from the inner surface S1 of the metallic housing 110, so that the connecting terminals 114 may be formed by part of the inner surface S1 of the metallic housing 110. More specifically, the descriptions and the drawings for forming the non-conductive layer 120 in the foregoing embodiments merely illustrates that the non-conductive layer 120 includes the first non-conductive spacer 120*a*, the second non-conductive spacer 120*b* and the non-conductive frame 120*c*. But in actual processes, it is also possible that the non-conductive layer 120 may be formed on part of the inner surface S1 of the metallic housing 110. For example, a non-conductive material may be remained on the inner surface S1 near the gaps while being filled into the gaps, or the non-conductive material may be remained on the inner surface S1 near four corners of the non-conductive frame 120*c* while forming the non-conductive frame 120*c*. Therefore, after the step of dyeing the outer surface S2 of the metallic housing 110 (step S160), part of the non-conductive layer 120 may be removed from the inner surface S1 of the metallic housing 110 based on actual requirements.

Figure 6:
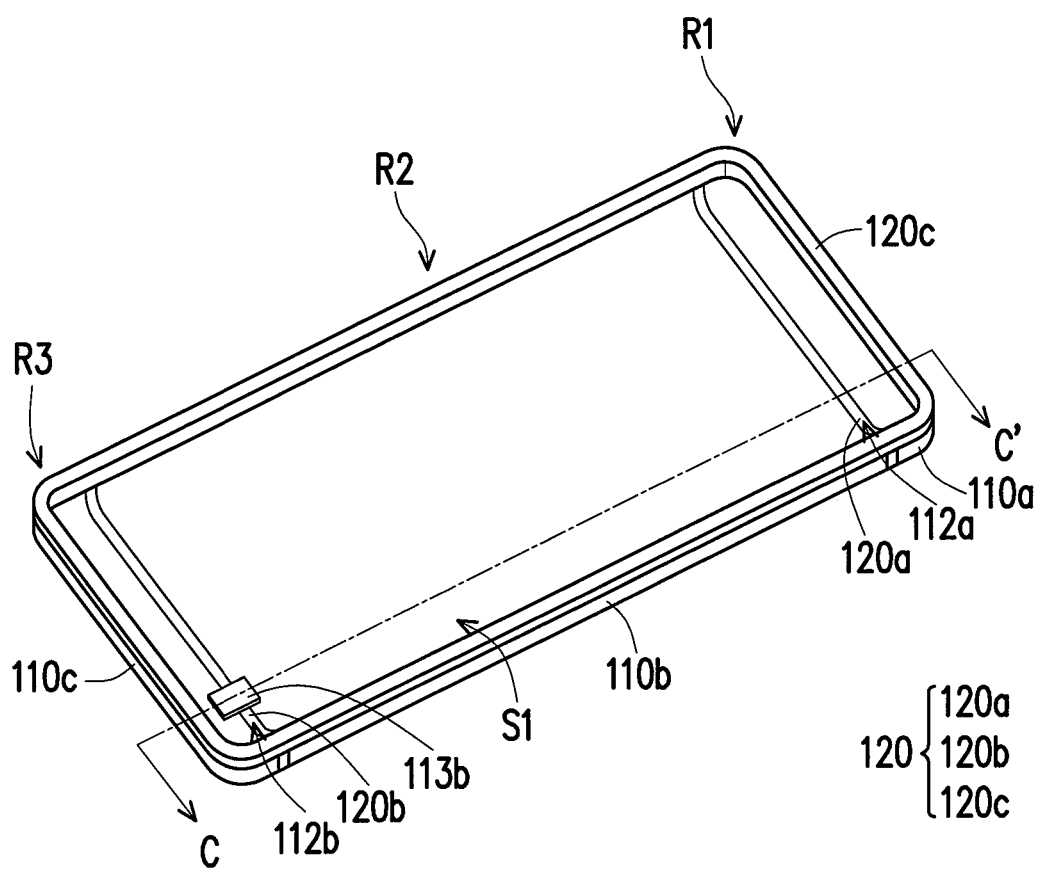
FIG. 6 is a schematic diagram of the casing of the electronic device of FIG. 3G.

Furthermore, referring to FIG. 3G and FIG. 6, FIG. 6 is a schematic diagram of the casing of the electronic device of FIG. 3G, and FIG. 3G may be considered as a cross-sectional diagram of FIG. 6 taken along line C-C'. At the time, the upper cover 110*a*, the middle cover 110*b*, and the lower cover 110*c* to be separated and electrically insulated from each other as mentioned above are practically still connected to each other through the supporting structures 113*a* and 113*b*. Therefore, after the step of dyeing the outer surface S2 of the metallic housing 110 (step S160), part of the metallic housing 110 may be removed from the inner surface S1 of the metallic housing 110 based on actual requirements. For instance, FIG. 6 shows a status in which the two supporting structures 113*a* and one of the supporting structures 113*b* in FIG. 5 are removed. The step of removing part of non-conductive layer 120 or part of the metallic housing 110 from the inner surface S1 of the metallic housing 110 includes, for example, a computer numerical control (CNC) treatment, but the invention is not limited thereto. Because the first non-conductive spacer 120*a* and the second non-conducive spacer 120*b* formed in the first gap 112*a* and the second gap 112*b* and exposed to the outer surface S2 of the metallic housing 110 divides the metallic housing 110 into the regions R1, R2, and R3 adjacent to but not contacting each other, after removing the two supporting structures 113*a* from the inner surface S1 of the metallic housing 110, the upper cover 110*a* and the middle cover 110b (which are corresponding to the regions R1 and R2, respectively) may be separated and electrically insulated from each other, whereas the middle cover 110b and the lower cover 110c (which are corresponding to the regions R2 and R3, respectively) may still be electrically connected to each other through the supporting structure 113b that is not yet removed. The connecting terminals 114 may be formed on the metallic housing 110 by part of the inner surface S1 corresponding to the regions R1 and regions R2 or R3. Accordingly, the regions R1 and R3 of the casing 100 of the electronic device may be electrically connected to the electronic device through the inner surface S1 to form an antenna, such that the electronic device may be provided with functions of the antenna. Therein, the region R1 may individually serve as one antenna, and the regions R2 and R3 electrically connected to each other through the supporting 113b may serve as another antenna region.

In the present embodiment, the non-conductive layer 120 may be selected from a material having favorable mechanical properties and etch-proof characteristic, such as polyphenylene sulfide (PPS), polybutylene terephthalate (PBT), or polyamide (PA), but the invention is not limited by above-said materials. Because the non-conductive layer 120 has the favorable mechanical properties, even if part of the non-conductive layer 120 are removed from the inner surface S1 of the metallic housing 110 by mechanical treatment, the mechanical strength and the bonding force between the metallic housing 110 and the non-conductive layer 120 cannot be affected, and the airtight ability between the metallic housing 110 and the non-conductive layer 120 cannot be affected either. In addition, because the non-conductive layer 120 has the etch-proof characteristic, even if the outer surface S2 of the metallic housing 110 is dyed by the anodizing process after the step of forming the non-conductive layer 120 on the inner surface S1 of the metallic housing 110, the non-conductive layer 120 cannot be etched by the process solvent used in the anodizing process.

On the other hand, because the favorable airtight ability is provided between the metallic housing 110 and the non-conductive layer 120, the process solvent used in the step of dyeing the outer surface S2 of the metallic housing 110 by the anodizing process cannot be remained between the metallic housing 110 and the non-conductive layer 120. In other words, because the zero-gap design is achieved between the metallic housing 110 and the non-conductive layer 120, the process solvent cannot enter spaces between the metallic housing 110 and the non-conductive layer 120. Therefore, in the subsequent dyeing process, because the process solvent is not remained between the metallic housing 110 and the non-conductive layer 120, the uneven dyeing of the casing 100 of the electronic device caused by the process solvent would not happen. In other words, because the apertures 130 provide the favorable airtight ability between the metallic housing 110 and the non-conductive layer 120, the uneven dyeing of the casing 100 of the electronic device caused by the process solvent leaked in the subsequent dyeing process and remained between the metallic housing 110 and the non-conductive layer 120 may be solved.

In summary, in the casing of the electronic device of the invention, multiple apertures are formed on the inner surface of the metallic housing by the nano molding technology, and the non-conductive layer is bonded on the inner surface of the metallic housing by the in-mold process, wherein part of the non-conductive layer is extended into the apertures, and part of the non-conductive layer is disposed in the gaps of the metallic housing to form the non-conductive spacers, so as to divide the metallic housing into multiple regions. Accordingly, the electronic device may provide the favorable mechanical strength as well as the favorable airtight ability between the metallic housing and the non-conductive layer. Moreover, the uneven dyeing of the casing of the electronic device may be avoided by preventing the process solvent from remaining between the metallic housing and the non-conductive layer during the subsequent process of dyeing the metallic housing by the anodizing process, such that the electronic device may provide an even color appearance.

Although the invention has been described with reference to the above embodiments, it is apparent to one of the ordinary skill in the art that modifications to the described embodiments may be made without departing from the spirit of the disclosure. Accordingly, the scope of the invention will be defined by the attached claims not by the above detailed descriptions.

What is claimed is:

1. A casing of an electronic device, comprising:
a metallic housing, having an inner surface and an outer surface opposite to the inner surface, the outer surface having a back side and lateral sides connecting with the back side, the inner surface being substantially a recessed structure, and the metallic housing having a first gap communicating the inner surface and the outer surface, wherein the metallic housing further comprises a second gap and at least one connecting terminal, and the second gap is substantially entirely formed on the back side of the outer surface of the metallic housing and communicates between two of the lateral sides that are opposite to each other; and
a first non-conductive spacer, at least partially disposed in the first gap of the metallic housing, wherein the first non-conductive spacer extends from a first side of the lateral sides of the metallic housing to the back side of the metallic housing.

2. The casing of the electronic devices as recited in claim 1, wherein the first gap and the second gap are substantially located at two opposite ends of the metallic housing and parallel with each other.

3. The casing of the electronic device as recited in claim 1, wherein the first non-conductive spacer is substantially a strip structure.

4. The casing of the electronic device as recited in claim 1, further comprising:
a second non-conductive spacer, wherein the second gap communicates the inner surface and the outer surface, and the second non-conductive spacer is at least partially disposed in the second gap of the metallic housing.

5. The casing of the electronic device as recited in claim 4, wherein the second non-conductive spacer extends from the first side of the lateral sides of the metallic housing, passes through the back side of the metallic housing, and extends to a second side of the lateral sides opposite to the first side of the metallic housing.

6. The casing of the electronic device as recited in claim 5, wherein the second non-conductive spacer is substantially a strip structure.

7. The casing of the electronic device as recited in claim 1, wherein the first gap and the second gap divide the metallic housing into a plurality of regions adjacent to each other, at least one of the plurality of regions serves as an antenna region of the electronic device.

8. The casing of the electronic device as recited in claim 7, wherein at least one of the plurality of regions is electrically coupled to the electronic device through the at least one connecting terminal.

9. The casing of the electronic device as recited in claim 1, wherein the at least one connecting terminal is formed by the inner surface of the metallic housing.

10. The casing of the electronic device as recited in claim 1, wherein the first non-conductive spacer further extends to a second side of the lateral sides opposite to the first side of the metallic housing.

* * * * *